United States Patent [19]
McQuilkin

[11] Patent Number: 6,166,569
[45] Date of Patent: Dec. 26, 2000

[54] TEST INTERFACE CIRCUITS WITH WAVEFORM SYNTHESIZERS HAVING REDUCED SPURIOUS SIGNALS

[75] Inventor: Christopher McQuilkin, Salem, N.H.

[73] Assignee: Analog Devices, Inc., Norwood, Mass.

[21] Appl. No.: 09/298,362

[22] Filed: Apr. 23, 1999

[51] Int. Cl.$^7$ ................................................. H03B 21/00
[52] U.S. Cl. ................................................. 327/105
[58] Field of Search .................... 327/105, 106, 327/107, 421, 580, 478, 494, 502, 508, 587, 588, 52, 56, 65

[56] References Cited

U.S. PATENT DOCUMENTS

| | | | |
|---|---|---|---|
| 4,303,837 | 12/1981 | Ansaldi et al. | 327/105 |
| 4,438,503 | 3/1984 | White et al. | 364/721 |
| 4,572,971 | 2/1986 | Necoechea | 307/260 |
| 4,603,303 | 7/1986 | Matsuno et al. | 330/11 |
| 5,115,203 | 5/1992 | Krett et al. | 330/251 |
| 5,842,155 | 11/1998 | Bryson et al. | 702/124 |

Primary Examiner—My-Trang Nu Ton
Attorney, Agent, or Firm—Koppel & Jacobs

[57] ABSTRACT

Waveform synthesizers are disclosed that generate an output signal $S_{OUT}$ with independent response to a common-mode input signal $S_{CM}$, an input data signal $S_D$ and a current programming signal $S_{PRGM}$. The synthesizers include a differential pair of first and second transistors that respectively respond to the input data signal $S_D$ and to a fixed reference signal $V_{REF}$. Because the second transistor is referenced to a fixed potential, current-pumping action of parasitic capacitances is reduced with consequent reduction of transient signals in the output signal $S_{OUT}$. Signal transients are further reduced with diodes that are arranged to block transient-current interchange between the first and second transistors. To enhance synthesizer speed, known bias potentials are established in the first and second transistors by use of a keep-alive current source, a bias transistor and a bias resistor and thermal differential heating in the differential pair is reduced with cascode transistors. The synthesizers are especially suited for use in ATE interface circuits.

27 Claims, 3 Drawing Sheets

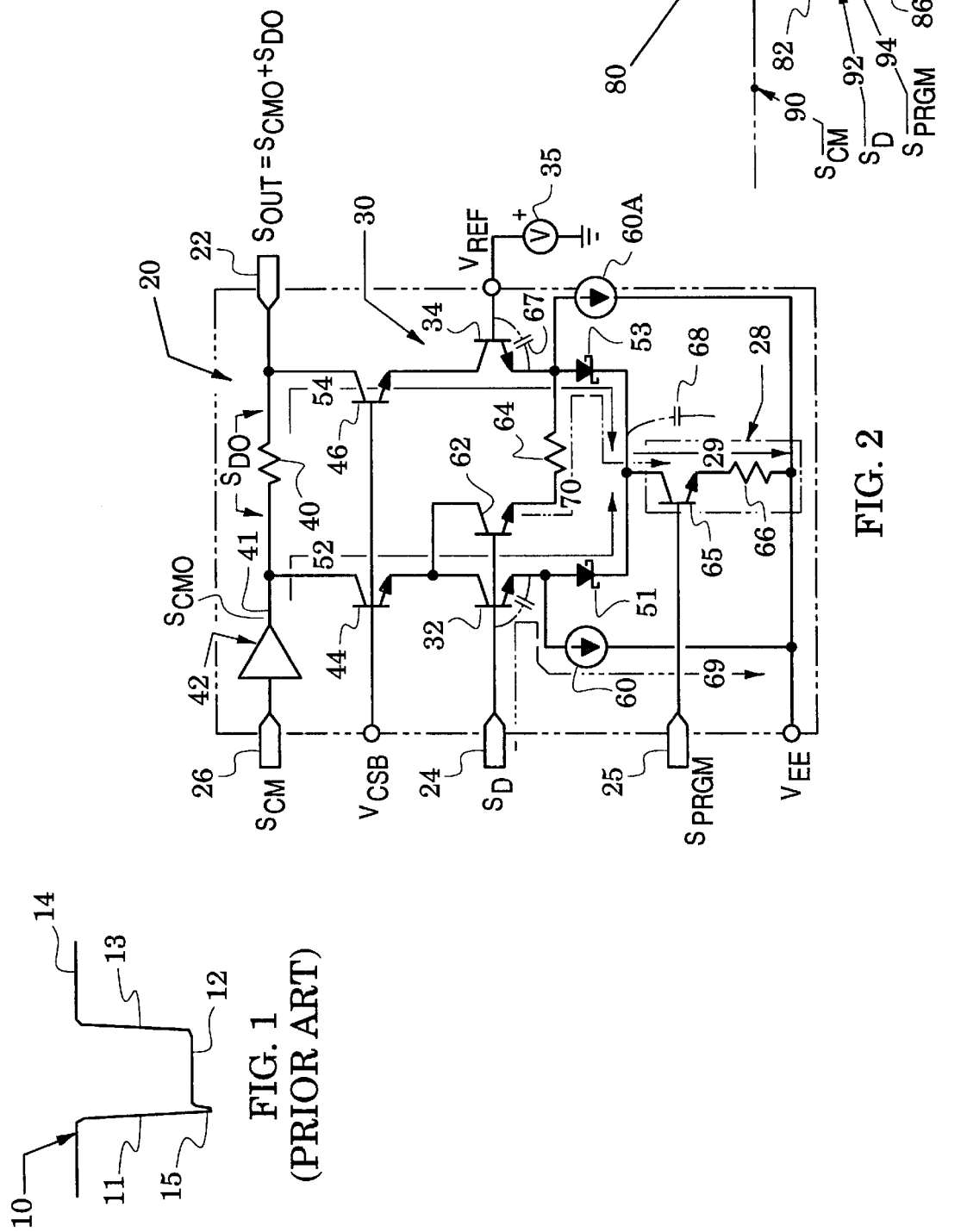

TEST INTERFACE CIRCUITS WITH WAVEFORM SYNTHESIZERS HAVING REDUCED SPURIOUS SIGNALS

BACKGROUND OF THE INVENTION

1. Field of the Invention

The present invention relates generally to waveform synthesizers and, more particularly, to their use as pin drivers in interface circuits of automatic test equipment.

2. Description of the Related Art

An exemplary use of transistor waveform synthesizers can be found in the field of automatic test equipment (ATE) where test waveforms are generated and applied to leads of devices under test (DUTs). Because these waveforms are typically applied via an ATE "pin" (i.e., a terminal), circuits configured for this purpose are typically referred to as "pin drivers". Preferably, the magnitudes, common-mode components and timing of pin-driver waveforms can be individually adjusted to accommodate a variety of DUTs and, in addition, the waveforms should have fast, symmetric rising and falling edges with minimal transients (i.e., spurious signals). Because ATEs typically employ a large number (e.g., 1024) of pin drivers, costs are significantly reduced if they are realized with simple circuits.

A first exemplary pin driver is shown in U.S. Pat. No. 4,572,971 to couple a level selector circuit to a DUT with a buffer circuit. The level selector circuit is arranged to accommodate reference voltages that represent both small and large voltage swings. In response to first and second reference voltages and a current switch, the level selector circuit generates a signal equal to a selected one of the reference voltages at an output node. The output node signals are applied to the DUT through a unity-gain buffer circuit having two stages that each comprise a complementary emitter follower.

A second exemplary pin driver is disclosed in U.S. Pat. No. 5,842,155 which couples a pulse forming circuit to a DUT with buffer and amplifier stages. The pulse forming network responds to high and low signal inputs by respectively charging and discharging a network node with currents of equal magnitudes so as to achieve pulses having equal positive and negative slew rates between pulse magnitudes equal to the high and low inputs. The pulses thus formed at the network node are then applied to the DUT through unity-gain buffer and amplifier stages which each comprise a complementary emitter follower structure.

Although these exemplary pin drivers can generate pulse signals with controlled amplitudes, they fail to provide for independent adjustment of a common-mode component and are relatively complex (e.g., the pulse forming circuit and buffer and amplifier stages of U.S. Pat. No. 5,842,155 include 11 transistors and the components of U.S. Pat. No. 4,572,971 are even more numerous.

Another exemplary pin driver has been formed with a buffer amplifier, a differential pair and a resistor. The resistor couples a DUT to the output of the buffer amplifier and the DUT is also coupled to the collector of one of the differential pair's transistors. A common-mode signal can then be applied to the input of the buffer amplifier and a data signal (e.g., a digital signal) applied to a differential input of the differential pair. In response to the data signal, the differential pair steers the current of a programmable current source to flow through the resistor and change the data voltage applied to the DUT. The common-mode signal applied to the DUT is thus controlled via the buffer amplifier and the amplitude of the data signal is varied via the programmed current of the current source.

Although this latter pin driver circuit facilitates the automatic control required in ATEs and is much simpler and accordingly less expensive than the first and second exemplary pin drivers, its generated waveforms generally include undesired spurious signals. For example, FIG. 1 illustrates a typical waveform 10 from this pin driver. It includes a falling edge 11 that descends a lower waveform level 12 and a rising edge 13 that ascends to an upper waveform level 14. Although the edges are steep and substantially linear, there is typically a pronounced overshoot 15 as the falling edge transitions to the lower level 12.

Because the performance of modern electronic circuits is constantly increasing, there is a demand for simple, inexpensive circuits that can generate high-speed test waveforms whose fidelity is superior to that of the waveform 10. In addition to applying test waveforms to DUTs, modern ATEs are also generally required to verify that the DUT can sink or source specified currents and to verify that the DUT provides specified response waveforms. To provide these functions at each DUT lead, a respective ATE interface circuit preferably contains a waveform synthesizer, an active load and a comparator.

SUMMARY OF THE INVENTION

The present invention is directed to simple, inexpensive waveform synthesizer structures that generate precise, controllable waveforms and is further directed to ATE interface circuits formed with these structures.

These synthesizer goals are realized with an amplifier, an impedance device, a signal current source and a differential pair of first and second transistors. The impedance device couples the amplifier to a synthesizer output port to generate a common-mode output signal $S_{CMO}$ in response to a common-mode input signal $S_{CM}$. The signal current source generates a signal current whose amplitude responds to a current programming signal $S_{PRGM}$.

The first and second transistors are arranged to respectively respond to an input data signal $S_D$ and a fixed reference signal $V_{REF}$ to steer at least a portion of the signal current through the impedance device to develop an output data signal $S_{DO}$. Accordingly, the synthesizer generates an output signal $S_{OUT} = S_{CMO} + S_{DO}$.

Because the second transistor is referenced to a fixed potential $V_{REF}$, current-pumping action of parasitic capacitances is reduced with consequent reduction of transient signals in the output signal $S_{OUT}$.

These signal transients are further reduced with Schottky diodes that are arranged to block transient-current interchange between the first and second transistors. To enhance synthesizer speed, a bias potential is established at the first transistor with a keep-alive current source that is coupled to introduce a keep-alive current through the first transistor. To establish a bias potential on the second transistor, a bias transistor is coupled to generate a trickle current in response to the input data signal $S_D$ and a bias resistor couples this trickle current to a current terminal of the second transistor.

Thermal heating and differential heating are reduced in the differential pair by inserting cascode transistors in series with output terminals of the differential pair.

Because of their structure, synthesizers of the invention generate precise waveforms whose common-mode levels, falling and rising edges and amplitudes are respectively responsive to the common-mode input signal $S_{CM}$, the input data signal $S_D$, and the current programming signal $S_{PRGM}$.

ATE interface circuits of the invention are realized by adding active loads and comparators to the waveform synthesizers and coupling all of these modules to a common point for communication with DUT leads.

The novel features of the invention are set forth with particularity in the appended claims. The invention will be best understood from the following description when read in conjunction with the accompanying drawings.

BRIEF DESCRIPTION OF THE DRAWINGS

FIG. 1 illustrates a waveform generated by a conventional pin driver;

FIG. 2 is a schematic of a waveform synthesizer embodiment of the present invention;

FIG. 3 illustrates an exemplary waveform generated by the waveform synthesizer of FIG. 2;

DETAILED DESCRIPTION OF THE PREFERRED EMBODIMENTS

Figures 4, 5:
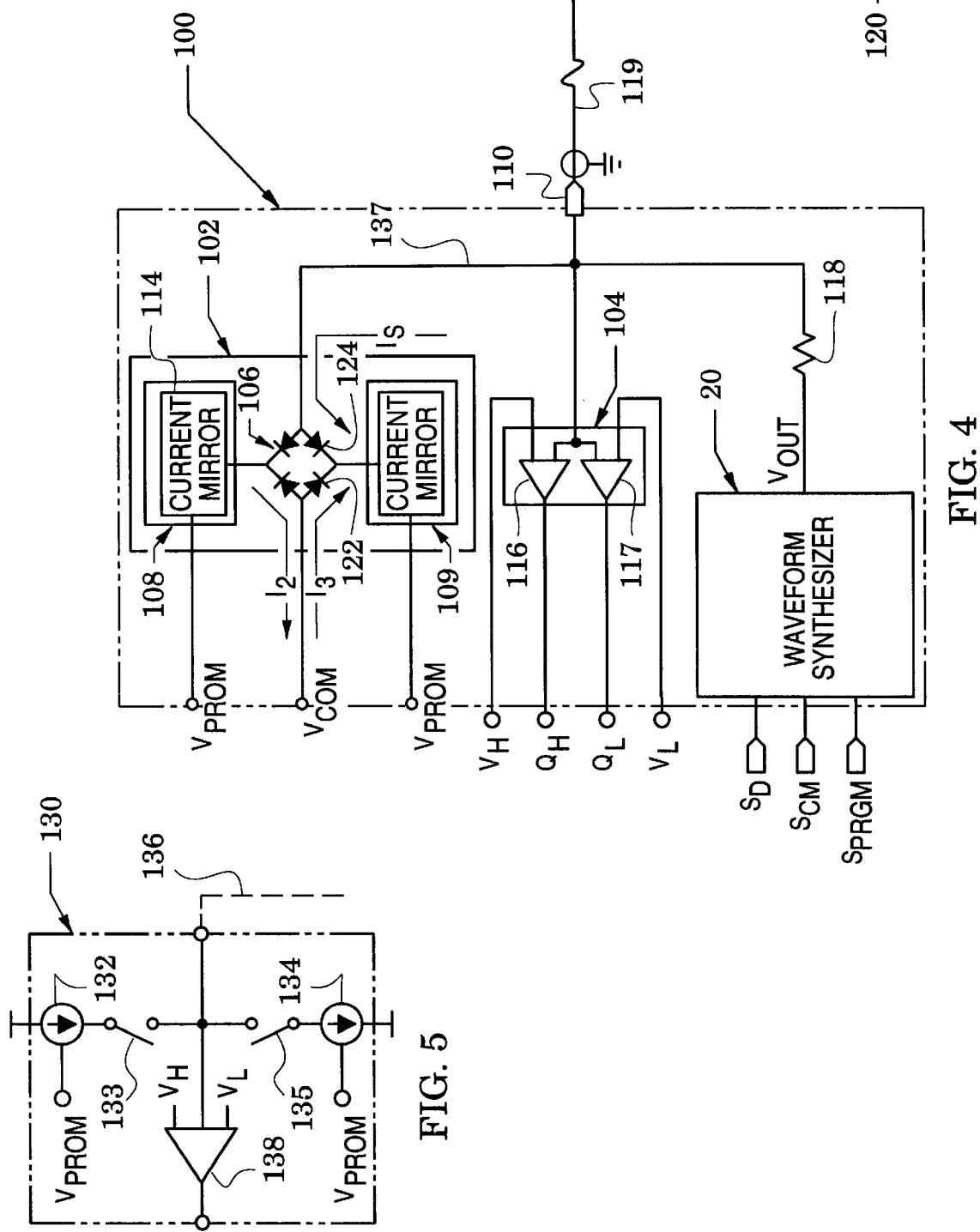
FIG. 4 is a block diagram of an interface circuit embodiment of the present invention that includes the waveform synthesizer of FIG. 2.
FIG. 5 illustrates another embodiment of an active load in the interface circuit of FIG. 4.

FIG. 2 illustrates an embodiment 20 of a waveform synthesizer that generates an output signal $S_{OUT}$ at an output port 22 in independent response to a data input signal $S_D$ at a data input port 24, a common-mode signal $S_{CM}$ at a common-mode input port 26 and a current programming signal $S_{PRGM}$ at an input port 25. Because the output signal $S_{OUT}$ responds independently to these signals, a variety of different output waveforms can be synthesized. The configuration of the waveform synthesizer 20 significantly reduces waveform spurious signals in the output signal $S_{OUT}$.

In particular, a signal current source 28 generates a signal current 29 and is coupled between a negative supply voltage $V_{EE}$ and emitters of a differential pair 30 of bipolar npn transistors 32 and 34. The base of transistor 32 is coupled to data input port 24 to receive the data input signal $S_D$ and the base of transistor 34 is coupled to receive a reference voltage $V_{REF}$ which can be generated, for example, by a voltage source 35.

An output impedance device in the form of a resistor 40 has a first end coupled to the output 41 of a buffer amplifier 42 and a second end coupled to the output port 22. A first cascode transistor 44 is preferably inserted between the first transistor 32 and the amplifier output 41 and a second cascode transistor 46 is preferably inserted between the second transistor 34 and the output port 26. The bases of these cascode transistors are biased with a cascode bias voltage $V_{CSB}$.

First and second diodes 51 and 53 respectively couple the emitters of the first and second transistors 32 and 34 to the current source 28. To enhance high-speed operation, these diodes are preferably Schottky diodes and are arranged to respectively pass portions 52 and 54 of the signal current 29 that are steered through the transistors 32 and 34. Accordingly, the cathodes of these diodes are connected to face the current source 28.

To insure an established potential at the emitter of transistor 32, a keep-alive current source 60 is coupled between that emitter and the supply voltage $V_{EE}$. To insure an established potential at the emitter of transistor 34, a bias transistor 62 is coupled to respond to the data input signal $S_D$ and a bias resistor 64 couples the emitter of this transistor to the emitter of transistor 34. In this particular embodiment, the bases and collectors of transistors 32 and 62 are respectively connected together.

The signal current source 28 is formed with a current transistor 65 whose emitter is coupled to the negative supply voltage $V_{EE}$ by a bias resistor 66 so that the signal current 29 is responsive to the current programming signal $S_{PRGM}$. Various conventional current-supply circuits can be substituted for the current source 28, e.g., the source can be an output portion of a programmable current mirror.

In operation of the waveform synthesizer 20, the transistors 32 and 34 of the differential pair 30 respectively respond to the data input signal $S_D$ and the reference voltage $V_{REF}$ to steer portions 52 and 54 of the signal current 29 to opposite ends of the resistor 40. Both of these current portions flow out of the typically low output impedance of the amplifier output 41 so that the current portion 54 generates an output data signal $S_{DO}$ across the resistor 40.

At the same time, the amplifier 42 responds to the common-mode signal $S_{CM}$ and generates a common-mode output signal $S_{CMO}$ at its output 41. Accordingly, the output signal $S_{OUT}$ at the output port 22 is a sum of the common-mode output signal $S_{CMO}$ and the output data signal $S_{DO}$ as indicated in FIG. 2.

It has been shown with circuit simulations that transient signals in the output signal $S_{OUT}$ are significantly reduced from those of the prior art which typically applied the input data signal $S_D$ to a differential input port formed, for example, with the bases of the differential pair 30. It is theorized that a significant source of the observed spurious signals (e.g., the overshoot 15 of FIG. 1) was a parasitic capacitance associated with the emitter of transistor 34, e.g., the transistor's emitter-base capacitance 67. Because the input data signal was applied differentially in the prior art, the base of transistor 34 rose and fell to charge and discharge the parasitic capacitance. Essentially, the capacitance acted as a current pump that pumped spurious currents to the output port 22 to thereby generate spurious signals.

Fixing the base potential of the transistor 34 (e.g., to the reference voltage $V_{REF}$) reduces the current pumping action and significantly lowers spurious signals at the output port 22. It has also been found that spurious signals are further reduced by insertion of the diodes 51 and 53. It is theorized that this advantageous effect is realized because these diodes permit the flow of steered currents 52 and 54 but block the interchange of spurious currents between the transistors 32 and 34. They may also block spurious currents originating in a spurious capacitance 68 that is associated with the collector of the current transistor 65.

As previously mentioned, the diodes 51 and 53 are preferably Schottky diodes to enhance the high-speed operation of the waveform synthesizer 20. Although these diodes further reduce output spurious signals, they cause the potentials of the emitters of the transistors 32 and 34 to be undefined when the signal current 29 is steered away from these transistors. Signal fidelity is enhanced by insuring that these circuit points always have established potentials so that they readily turn on in response to their respective input signals of $S_D$ and $V_{REF}$.

This insurance is realized for transistor 32 by the keep-alive current source 60 which generates a keep-alive current 69 that flows through the transistor 32 and establishes a potential at its emitter (equal to the data input signal $S_D$ less the diode drop of the transistor's base-emitter junction). Thus, even when the current portion 52 drops to zero (i.e., all of the signal current 29 has been steered to form the current portion 54), a known potential is established at the emitter of transistor 32.

Although an established potential can be insured for the transistor 34 with a similar keep-alive current source 60A, it has been found preferable to realize this transistor's emitter potential with the bias transistor 62 and bias resistor 64. When the input data signal $S_D$ exceeds the reference voltage $V_{REF}$, a small trickle current 70 flows through the bias resistor and through the current source 28. A potential (of $S_D$ less a diode drop of the bias transistor 62 and less a small voltage drop across the bias resistor 64) is thus established at the emitter of transistor 34.

The cascode transistors 44 and 46 of FIG. 2 establish known and fixed potentials ($V_{CSB}$ less a base-emitter diode drop) at the collectors of the differential pair 30. The cascode transistors therefore lower these collector potentials to reduce thermal heating in the differential pair 30 and also significantly reduce differential heating in the transistors 32 and 34. In the absence of the cascode transistors, differential thermal input to the transistors 32 and 34 is a strong function of the duty cycle of the input data signal $S_D$. Because this differential heating is significantly reduced by the cascode transistors 44 and 46, waveform variations (e.g., timing skews) are reduced in the output signal $S_{OUT}$.

Circuit simulations have shown that the waveform synthesizer 20 responds to digital data signals by synthesizing precise output signals at the output port 22. An exemplary output signal waveform 80 is shown in FIG. 3 in which an upper signal level 81 is substantially the common-mode output signal $S_{CMO}$ generated by the amplifier 42 of FIG. 2.

As the signal current (29 in FIG. 2) is steered to sequentially form the current portions (52 and 54 in FIG. 2), the output signal 80 of FIG. 3 falls steeply and substantially linearly along a falling edge 82 to a lower signal level 83 and then rises steeply and substantially linearly along a rising edge 84 to the upper signal level 81. Because of the waveform synthesizer's structures, the output waveform 80 exhibits minimal spurious signals, e.g., a slight overshoot 86 at the lower level 83.

As indicated by response arrows 90, 92 and 94, the shape of the output waveform responds to the common-mode signal $S_{CM}$, the data input signal $S_D$ and the current programming signal $S_{PRGM}$ of FIG. 2. In particular, the upper level 81 moves up and down in response to the common-mode signal $S_{CM}$ and the locations of falling and rising edges 82 and 84 are determined by the data input signal $S_D$ as it steers the signal current (29 in FIG. 2).

Finally, the signal amplitude 96 (between upper and lower signal levels 81 and 83) is determined by the current programming signal $S_{PRGM}$ because the amplitude 95 is directly responsive to the amplitude of the steered current 54 in transistor 34 of the differential pair 30. The waveform 80 particularly demonstrates the fidelity, rapid response and flexibility of waveform synthesizers of the invention.

FIG. 4 illustrates a test interface circuit 100 that combines a programmable active load 102 and a response comparator 104 with the waveform synthesizer 20 of FIG. 2. The active load positions a diode bridge 106 between programmable current sources 108 and 109. One side of the bridge is supplied with a commutation voltage $V_{COM}$ and the other side is coupled to a terminal 110 that can be configured to contact a DUT component, e.g., a DUT lead. The current sources are typically formed with current mirrors 114 whose current magnitudes respond to programmable voltages $V_{PROM}$.

The response comparator 104 is typically a window comparator formed with first and second comparators 116 and 117 that each have an input coupled to the terminal 110 and another input respectively connected to programmable high and low reference voltages $V_H$ and $V_L$. Comparator output signals appear at ports $Q_H$ and $Q_L$ and indicate whether DUT response signals are within the range $Q_H$–$Q_L$ or not. The output port 22 of the waveform synthesizer 20 may be coupled to the terminal 110 by an isolation resistor 118 that reduces interference with DUT response signals.

Because it includes the waveform synthesizer 20, the comparator 104 and the active load 102 and because the waveform synthesizer is employed as a pin driver, the interface circuit 100 may also be referred to as a driver/comparator/load (DCL) module. The interface circuit 100 is typically coupled through a transmission line 119 to a DUT 120. In operation of the interface circuit, it generates and applies precise test waveforms with its waveform synthesizer 20, measures DUT response signals with its response comparator 104 and applies specified current sinks or sources with its active load 102. The flexible but relatively simple and inexpensive structure of the interface circuit 100 facilitates its use in large numbers in ATEs for simultaneous testing of DUT leads.

In an exemplary test of a DUT that is to source 1 milliamp while delivering 5 volts at the terminal 110, the current source 109 would be set to sink 1 milliamp and the commutation voltage $V_{COM}$ set to a voltage less than 5 volts. If the DUT meets its specifications, its source current $I_S$ flows as shown to the current source 109 while a second current $I_2$ flows from the current source 108 and through the other side of the bridge 106. If the DUT cannot source the specified 1 milliamp, a third current $I_3$ flows through diode 122 so that $I_S+I_3$ equals the 1 milliamp sink current of the current source 109. Because diodes 122 and 124 are now both in conduction, the voltage at the terminal 110 must equal $V_{COM}$. The fact this is below the DUTs specified 5 volts is sensed by the comparator 104.

The teachings of the interface circuit 100 can be practiced with a variety of conventional comparator and active load circuits. The general structure of such circuits is exemplified in the circuit 130 of FIG. 5 which couples programmable current sources 132 and 134 to the terminal 110 with switches 133 and 135 (via a lead 136 which is similar to a lead 137 of FIG. 4). The potential of the terminal 110 is measured with a window comparator 138. A specified source or sink current can thus be switched to the terminal 110 while a DUT response at the terminal 110 is measured and compared to a DUT specification.

Figure 6:
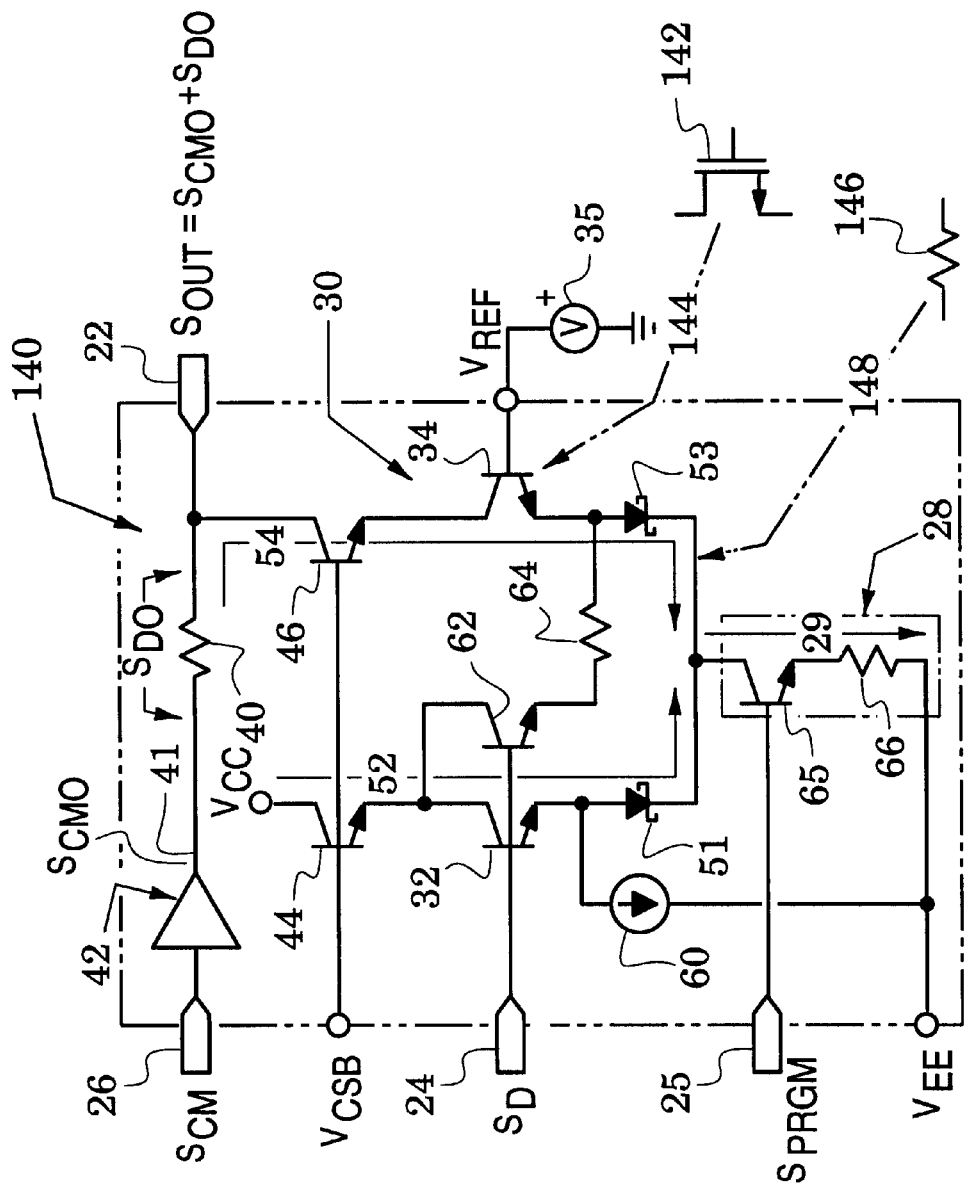
FIG. 6 is a schematic of another waveform synthesizer of the present invention.

FIG. 6 illustrates another waveform synthesizer 140 that is similar to the synthesizer 20 of FIG. 2 with like elements indicated by like reference numbers. The synthesizer 140 demonstrates that various synthesizer embodiments can be formed to realize the advantageous of the invention.

For example, the teachings of the invention have been illustrated with reference to particular transistors, e.g., the npn bipolar transistors of FIG. 2. However, the teachings of the invention may be practiced with pnp bipolar transistors and with various other transistor types such as CMOS transistors. This is exemplified in FIG. 6 where a CMOS transistor 142 replaces the bipolar transistor 34 as indicated by a replacement arrow 144.

Although operation of waveform synthesizers of the invention have been generally described with reference to data signals which are shown as bi-level signals (e.g., digital signals), the synthesizers need not be so limited. To enhance their response to analog signals at their input ports (e.g., input ports 24, 25 and 26 of FIG. 2), resistors can be inserted between the transistors of the differential pair 30 and the signal current source 28.

This is exemplified in FIG. 6 where a resistor 146 is inserted between the transistor 34 and the current source 28 as indicated by insertion arrow 148. In this embodiment, the steered currents 52 and 54 are typically less than the signal current 29. To enhance analog use, the amplifier 42 of FIG. 2 is preferably a complementary operational amplifier.

Although the collector of transistor 32 of FIG. 2 has been shown coupled to the output 41 of the amplifier 42, it may be coupled to steer its current 52 elsewhere (e.g., to a positive supply voltage $V_{CC}$).

Waveform synthesizers of the invention are suitable for the generation of high-speed (e.g., ~1 GHz) waveforms with fast rise and fall times (e.g., ~100 picoseconds). They are particularly suited for use as ATE pin drivers and for their realization as application specific integrated circuits (ASICs) which can significantly reduce their size and cost when produced in large volumes.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A waveform synthesizer that generates an output signal at an output port in response to a common-mode input signal, a data input signal and a fixed reference signal, the synthesizer comprising:
   an amplifier that responds to said common-mode input signal;
   an impedance device that couples said amplifier to said output port;
   a signal current source that generates a signal current; and
   a differential pair of first and second transistors that are coupled to said signal current source and that respectively respond to said input data signal and said fixed reference signal to steer at least a portion of said signal current through said impedance device.

2. The waveform synthesizer of claim 1, further including:
   a first diode arranged between said first transistor and said signal current source to pass any portion of said signal current that flows through said first transistor; and
   a first keep-alive current source that is coupled to generate a keep-alive current in said first transistor.

3. The waveform synthesizer of claim 2, further including:
   a second diode arranged between said second transistor and said signal current source to pass any portion of said signal current that flows through said second transistor; and
   a second keep-alive current source that is coupled to generate a keep-alive current in said second transistor.

4. The waveform synthesizer of claim 1, further including:
   a first cascode transistor coupled between said first transistor and an output of said amplifier; and
   a second cascode transistor coupled between said second transistor and said output port.

5. The waveform synthesizer of claim 1, wherein said signal current source includes:
   a signal transistor biased to generate said signal current; and
   a resistor coupled to said signal transistor to conduct said signal current.

6. The waveform synthesizer of claim 1, wherein said transistors are bipolar transistors.

7. The waveform synthesizer of claim 1, wherein said impedance device is a resistor.

8. The waveform synthesizer of claim 1, wherein said amplifier is a complementary buffer amplifier.

9. A waveform synthesizer that generates an output signal at an output port in response to a common-mode input signal, a data input signal and a fixed reference signal, the synthesizer comprising:
   an amplifier that responds to said common-mode input signal;
   an impedance device that couples said amplifier to said output port;
   a signal current source that generates a signal current;
   a differential pair of first and second transistors that respectively respond to said input data signal and said fixed reference signal to steer at least a portion of said signal current through said impedance device;
   a first diode arranged between said first transistor and said signal current source to pass any portion of said signal current that flows through said first transistor; and
   a first keep-alive current source that is coupled to generate a keep-alive current in said first transistor;
   and further including:
   a second diode arranged between said second transistor and said signal current source to pass any portion of said signal current that flows through said second transistor;
   a bias transistor coupled to respond to said data input signal; and
   a bias resistor coupled to carry a current of said bias transistor and pass it through said second diode.

10. The waveform synthesizer of claim 9, wherein said first and second diodes are Schottky diodes.

11. A waveform synthesizer that generates an output signal at an output port in response to a common-mode input signal, a data input signal and a fixed reference signal, the synthesizer comprising:
   an amplifier that responds to said common-mode input signal;
   an impedance device that couples said amplifier to said output port;
   a signal current source that generates a signal current; and
   a differential pair of first and second transistors that respectively respond to said input data signal and said fixed reference signal to steer at least a portion of said signal current through said impedance device;
   wherein said impedance device has a first end coupled to said first transistor and a second end coupled to said second transistor.

12. A waveform synthesizer that generates an output signal at an output port in response to a common-mode input signal, a data input signal and a fixed reference signal, the synthesizer comprising:
   an amplifier coupled to respond to said common-mode input signal;
   a resistor that couples an output of said amplifier to said output port; and a differential pair of first and second transistors that respectively respond to said data input signal and said reference signal to steer at least a portion of a differential-pair current through said resistor;

said amplifier and said differential pair thereby respectively generating a common-mode output signal and a differential output signal at said output port.

13. The waveform synthesizer of claim 12, further including a current source that generates said differential-pair current.

14. The waveform synthesizer of claim 12, further including:

a current source that generates said differential-pair current;

a first diode inserted between said first transistor and said current source to pass any portion of said differential-pair current that flows through said first transistor; and a first keep-alive current source coupled to pass a keep-alive current through said first transistor.

15. The waveform synthesizer of claim 14, further including:

a second diode inserted between said second transistor and said current source to pass any portion of said differential-pair current that flows through said second transistor; and a second keep-alive current source coupled to pass a keep-alive current through said second transistor.

16. A waveform synthesizer that generates an output signal at an output port in response to a common-mode input signal, a data input signal and a fixed reference signal, the synthesizer comprising:

an amplifier coupled to said output port and coupled to respond to said common-mode input signal; and a differential pair of first and second transistors that respectively respond to said data input signal and said reference signal to steer at least a portion of a differential-pair current to said output port;

and further including a resistor that couples an output of said amplifier to said output port to facilitate generation of said common-mode output signal and said differential output signal;

wherein said resistor has a first end coupled to said first transistor and a second end coupled to said second transistor;

said amplifier and said differential pair thereby respectively generating a common-mode output signal and a differential output signal at said output port.

17. The waveform synthesizer of claim 16, further including:

a first cascode transistor coupled between said first transistor and said first end of said resistor; and a second cascode transistor coupled between said second transistor and said second end of said resistor.

18. A waveform synthesizer that generates an output signal at an output port in response to a common-mode input signal, a data input signal and a fixed reference signal, the synthesizer comprising:

an amplifier coupled to said output port and coupled to respond to said common-mode input signal;

a differential pair of first and second transistors that respectively respond to said data input signal and said reference signal to steer at least a portion of a differential-pair current to said output port;

a differential-pair current source that generates said differential-pair current;

a first diode inserted between said first transistor and said differential-pair current source to pass any portion of said differential-pair current that flows through said first transistor; and a first keep-alive current source coupled to pass a keep-alive current through said first transistor;

and further including:

a second diode inserted between said second transistor and said current source to pass any portion of said differential-pair current that flows through said second transistor;

a bias transistor coupled to respond to said data input signal; and a bias resistor coupled to carry a current of said bias transistor and pass it through said second diode;

said amplifier and said differential pair thereby respectively generating a common-mode output signal and a differential output signal at said output port.

19. An interface circuit that loads an output port, measures response signals at said output port and generates an output signal at said output port in response to a common-mode input signal, a data input signal and a fixed reference signal, the synthesizer comprising:

an active load coupled to source and sink currents to and from said output port;

a comparator coupled to receive and measure said response signals at said output port;

an amplifier that responds to said common-mode input signal;

a resistor that couples said amplifier to said output port;

a signal current source that generates a signal current; and a differential pair of first and second transistors that are coupled to said signal current source and that respectively respond to said input data signal and said fixed reference signal to steer at least a portion of said signal current through said impedance device.

20. The interface circuit of claim 19, wherein said active load includes:

first and second programmable current sources coupled to said output port; and a diode bridge that couples said first and second current sources to said output port.

21. The interface circuit of claim 19, wherein said comparator is a window comparator.

22. The interface circuit of claim 19, further including:

a first diode inserted between said first transistor and said signal current source to pass any portion of said signal current that flows through said first transistor; and a first keep-alive current source that is coupled to generate a keep-alive current in said first transistor.

23. The interface circuit of claim 23, further including:

a second diode inserted between said second transistor and said signal current source to pass any portion of said signal current that flows through said second transistor; and a second keep-alive current source that is coupled to generate a keep-alive current in said second transistor.

24. The interface circuit of claim 19, wherein said transistors are bipolar transistors.

25. An interface circuit that loads an output port, measures response signals at said output port and generates an output signal at said output port in response to a common-mode input signal, a data input signal and a fixed reference signal, the synthesizer comprising:

an active load coupled to source and sink currents to and from said output port;

a comparator coupled to receive and measure said response signals at said output port;

an amplifier that responds to said common-mode input signal;

a resistor that couples said amplifier to said output port;

a signal current source that generates a signal current:

a differential pair of first and second transistors that respectively respond to said input data signal and said fixed reference signal to steer at least a portion of said signal current through said impedance device a first diode inserted between said first transistor and said signal current source to pass any portion of said signal current that flows through said first transistor; and a first keep-alive current source that is coupled to generate a keep-alive current in said first transistor;

and further including:

a second diode inserted between said second transistor and said signal current source to pass any portion of said signal current that flows through said second transistor;

a bias transistor coupled to respond to said data input signal; and a bias resistor coupled to carry a current of said bias transistor and pass it through said second diode.

26. The interface circuit of claim 25, wherein said first and second diodes are Schottky diodes.

27. An interface circuit that loads an output port, measures response signals at said output port and generates an output signal at said output port in response to a common-mode input signal, a data input signal and a fixed reference signal, comprising:

an active load coupled to source and sink currents to and from said output port;

a comparator coupled to receive and measure said response signals at said output port;

an amplifier that responds to said common-mode input signal;

a resistor that couples said amplifier to said output port;

a signal current source that generates a signal current; and a differential pair of first and second transistors that respectively respond to said input data signal and said fixed reference signal to steer at least a portion of said signal current through said impedance device:

and further including:

a first cascode transistor inserted between said first transistor and one end of said impedance device; and a second cascode transistor inserted between said second transistor and another end of said impedance device.

* * * * *